United States Patent
Slack et al.

(10) Patent No.: US 10,068,973 B2
(45) Date of Patent: *Sep. 4, 2018

(54) DOPED ALUMINUM NITRIDE CRYSTALS AND METHODS OF MAKING THEM

(71) Applicants: Glen A. Slack, Scotia, NY (US); Leo J. Schowalter, Latham, NY (US)

(72) Inventors: Glen A. Slack, Scotia, NY (US); Leo J. Schowalter, Latham, NY (US)

(73) Assignee: CRYSTAL IS, INC., Green Island, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/348,507

(22) Filed: Nov. 10, 2016

(65) Prior Publication Data

US 2017/0084702 A1    Mar. 23, 2017

Related U.S. Application Data

(63) Continuation of application No. 14/225,999, filed on Mar. 26, 2014, now Pat. No. 9,525,032, which is a continuation of application No. 12/642,182, filed on Dec. 18, 2009, now Pat. No. 8,747,552, which is a continuation of application No. 11/633,667, filed on Dec. 4, 2006, now Pat. No. 7,641,735.

(60) Provisional application No. 60/741,701, filed on Dec. 2, 2005.

(51) Int. Cl.
| | |
|---|---|
| *C30B 29/38* | (2006.01) |
| *H01L 29/207* | (2006.01) |
| *C30B 23/00* | (2006.01) |
| *C30B 29/40* | (2006.01) |
| *H01L 29/20* | (2006.01) |
| *H01L 21/02* | (2006.01) |
| *H01L 21/225* | (2006.01) |
| *H01L 33/32* | (2010.01) |

(52) U.S. Cl.
CPC ............ *H01L 29/207* (2013.01); *C30B 23/00* (2013.01); *C30B 29/403* (2013.01); *H01L 21/0254* (2013.01); *H01L 21/02579* (2013.01); *H01L 21/2258* (2013.01); *H01L 29/2003* (2013.01); *H01L 33/325* (2013.01)

(58) Field of Classification Search
CPC .............................. C30B 29/38; C30B 29/403
See application file for complete search history.

(56) References Cited

U.S. PATENT DOCUMENTS

| 7,641,735 | B2 * | 1/2010 | Slack | ...................... | C30B 23/00 117/2 |
| 8,747,552 | B2 * | 6/2014 | Slack | ...................... | C30B 23/00 117/2 |
| 9,525,032 | B2 * | 12/2016 | Slack | ...................... | C30B 23/00 |

* cited by examiner

Primary Examiner — Robert M Kunemund
(74) Attorney, Agent, or Firm — Morgan, Lewis & Bockius LLP

(57) ABSTRACT

Fabrication of doped AlN crystals and/or AlGaN epitaxial layers with high conductivity and mobility is accomplished by, for example, forming mixed crystals including a plurality of impurity species and electrically activating at least a portion of the crystal.

23 Claims, 3 Drawing Sheets

DOPED ALUMINUM NITRIDE CRYSTALS AND METHODS OF MAKING THEM

CROSS-REFERENCE TO RELATED APPLICATIONS

The present application is a continuation of U.S. patent application Ser. No. 14/225,999, filed Mar. 26, 2014 now U.S. Pat. No. 9,525,032, which is a continuation of U.S. patent application Ser. No. 12/642,182, filed Dec. 18, 2009 now U.S. Pat. No. 8,747,552, which is a continuation of U.S. patent application Ser. No. 11/633,667, filed Dec. 4, 2006 now U.S. Pat. No. 7,641,735, which claims the benefits of and priority to U.S. Provisional Application Ser. No. 60/741,701, filed on Dec. 2, 2005, the entire disclosures of which are hereby incorporated by reference.

GOVERNMENT SUPPORT

This invention was made with United States Government support under 70NANB4H3051 awarded by the National Institute of Standards and Technology (NIST). The United States Government has certain rights in the invention.

BACKGROUND

Semiconductor materials exhibit controllable optical and electrical properties, such as conductivity, over a wide range. Such control is enabled by use of dopants, which are impurities introduced into the crystalline lattice of the semiconductor material to serve as sources of electrons (negative charges) or holes (positive charges). Controllable doping enables the fabrication of a wide range of semiconductor devices, e.g., light-emitting diodes (LEDs), lasers, and transistors.

Nitride-based semiconductors such as gallium nitride (GaN) and aluminum nitride (AlN) are of great interest technologically, in part because of their wide bandgaps. Controllable and repeatable doping of these materials enables the fabrication of light-emitting devices, such as LEDs and lasers, that emit light at short wavelengths, i.e., at blue, violet, and even ultraviolet wavelengths. Moreover, n- and p-type nitrides can be utilized in the fabrication of transistors suited for high power and/or high temperature applications. In an n-type semiconductor, the concentration of electrons is much higher then the concentration of holes; accordingly, electrons are majority carriers and dominate conductivity. In a p-type semiconductor, by contrast, holes dominate conductivity.

Making p-type nitride semiconductor materials can be difficult generally, and obtaining conductive crystals or epitaxial layers of p-type aluminum nitride (AlN), or of $Al_xGa_{1-x}N$ alloys with high Al content, has posed particular challenges. Adding carbon and oxygen to AlN causes it to turn blue, which means it absorbs in the red (unlike more typical AlN, grown without added impurities, which tends to absorb in the blue due to N vacancies). Some conductivity measurements have suggested that the blue crystal is p-type while other work has cast doubt on the possibility of making p-type AlN at all. The acceptor levels from most substitutional dopants in AlN will tend to be rather deep in the energy bandgap, making it difficult to achieve reasonable conductivity levels unless high concentrations of the dopant are used. Unfortunately, the solubility of a single p-type impurity atom tends to be rather low, and tendency of the crystal to form charge compensating vacancy defects will be high.

In any case, the only p-type AlN materials produced to date have involved small crystals, only a few millimeters (mm) in size, grown in the laboratory. N-type doping of nitride materials also presents difficulties. Thus, success in creating large, conductive crystals has proven elusive.

DESCRIPTION OF THE INVENTION

Brief Summary of the Invention

The present invention facilitates formation of large-scale (e.g., in some embodiments, having diameters of at least 1 cm) doped AlN crystals. The dopants may be n-type and/or p-type, and following electrical activation, the crystal will exhibit sufficient conductivity and/or mobility characteristics to support formation of commercial devices.

In accordance with the present invention, an acceptor level is created within the perfect, stoichiometric AlN or AlGaN lattice by introducing a substitutional impurity that has one fewer electron than aluminum (Al) or nitrogen (N). Charge-compensating defects such as vacancies on the N anion site (designated as $V_N$) or impurities with an extra electron are desirably avoided but, more generally, are either reduced in density or less active. In order to use atoms that have nearly the same diameter as Al or N and avoid local strain, dopants are preferably selected from the upper part of the periodic table. Choices for the Al site include beryllium (Be), magnesium (Mg), and zinc (Zn) while carbon (C) is one choice for the N site. Dopants such as lithium (Li) with two fewer electrons than Al may also be used to make p-type AlN and AlGaN.

The p-type doping of AlN and AlGaN may be accomplished by the introduction of a single substitutional impurity such as Be, Mg, Zn, Li or C into the AlN lattice. This general method is called mono-doping. It is typically followed by a treatment of the crystal to electrically activate the impurity species.

Accordingly, in a first aspect, the invention features a method of forming a doped AlN crystal including forming a mixed crystal containing AlN and a plurality of impurity species, and electrically activating at least one impurity species in at least a portion of the mixed crystal. In an embodiment, the mixed crystal is sliced into a plurality of wafers prior to the step of electrically activating. After the step of electrically activating, the doped AlN crystal may have a conductivity greater than approximately $10^{-5}$ $\Omega^{-1}$ $cm^{-1}$, or even greater than approximately $3\times10^{-3}$ $\Omega^{-1}$ $cm^{-1}$, and/or a mobility greater than approximately 25 $cm^2$ $V^{-1}$ $s^{-1}$ at room temperature.

Embodiments of the invention may include one or more of the following features. Prior to electrical activation, the mixed crystal may have a conductivity less than approximately $10^{-2}$ $\Omega^{-1}$ $cm^{-1}$ at room temperature, and after electrical activation, the doped AlN crystal may be n-type or p-type. The plurality of impurity species may include a substitutional dopant, for example, C, O, Be, Mg, Zn, or Si. The plurality of impurity species may include an interstitial dopant, for example, Li, and the step of electrically activating may include at least one of annealing, immersing in molten metal, or applying a voltage to at least a portion of the mixed crystal. Such a step may result in the extraction of the interstitial dopant from at least a portion of the mixed crystal.

The plurality of impurity species may include at least one donor and at least one acceptor. In an embodiment, the at least one donor and the at least one acceptor occupy a cation lattice site. The at least one donor includes Si and the at least one acceptor includes Be, Mg, or Zn. In another embodiment, the at least one donor and the at least one acceptor occupy an anion lattice site. The at least one donor includes O and the at least one acceptor includes C. In various embodiments, the step of electrically activating includes annealing.

In another aspect, the invention features a method of forming a p-type AlN crystal including forming a mixed crystal containing AlN and a source of substitutional impurities, and electrically activating at least some of the substitutional impurities.

Embodiments of the invention may include one or more of the following features. The source of substitutional impurities may include $Be_3N_2$. The step of electrically activating at least a portion of the substitutional impurities may include converting $Be_3N_2$ to $Be_3N_3$, and may include subjecting the mixed crystal to a pressure of less than approximately 100 MPa and a temperature of less than approximately 2300° C. in a nitrogen ambient. Alternatively or in addition, the source of substitutional impurities may include at least one of $Mg_3N_2$, $Zn_3N_2$, $Li_3N$, BeO, $BeSiN_2$, LiBeN, $Be_2C$, $MgSiN_2$, $LiSi_2N_3$, LiMgN, or LiZnN.

In still another aspect, the invention features a doped AlN crystal with a thickness at least approximately 0.1 mm, a diameter at least approximately 1 cm, and a conductivity greater than approximately $10^{-5}$ $\Omega^{-1}$ $cm^{-1}$ at room temperature. The conductivity may be greater than approximately $3\times10^{-3}$ $\Omega^{-1}$ $cm^{-1}$ at room temperature. The AlN crystal may have a mobility greater than approximately 25 $cm^2$ $V^{-1}$ $s^{-1}$ at room temperature. The diameter may be at least approximately 2 cm. The AlN crystal may include at least two substitutional dopants selected from the group consisting of C, O, Be, Mg, Zn, and Si.

In yet another aspect, the invention features a doped, p-type AlN crystal with a mobility greater than approximately 25 $cm^2$ $\Omega^{-1}$ $s^{-1}$ at room temperature. The AlN crystal may include at least at least two substitutional dopants selected from the group consisting of C, O, Be, Mg, Zn, and Si.

Another aspect of the invention features a doped, n-type single-crystal AlN structure with a thickness of at least approximately 0.1 mm and a diameter of at least approximately 1 cm. The mobility of the AlN structure may be greater than approximately 25 $cm^2$ $V^{-1}$ $s^{-1}$ at room temperature. The AlN crystal may include at least two substitutional dopants selected from the group consisting of C, O, Be, Mg, Zn, and Si.

In another aspect, the invention features a doped, single-crystal AlN structure with the dimensions of at least 2 mm by 2 mm by 1 mm and a conductivity greater than approximately $10^{-5}$ $\Omega^{-1}$ $cm^{-1}$ at room temperature. The AlN crystal may include at least two substitutional dopants selected from the group consisting of C, O, Be, Mg, Zn, and Si.

In another aspect, the invention features a doped, p-type AlGaN epitaxial layer having an Al concentration greater than approximately 50% and a conductivity greater than approximately $10^{-5}$ $\Omega^{-1}$ $cm^{-1}$ at room temperature. The conductivity may be greater than approximately $3\times10^{-3}$ $\Omega^{-1}$ $cm^{-1}$ at room temperature. The epitaxial layer may have a mobility greater than approximately 25 $cm^2$ $V^{-1}$ $S^{-1}$ at room temperature. In an embodiment, the epitaxial layer includes at least two substitutional dopants selected from the group consisting of C, O, Be, Mg, Zn, and Si.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION OF THE PREFERRED EMBODIMENTS

Figure 1:
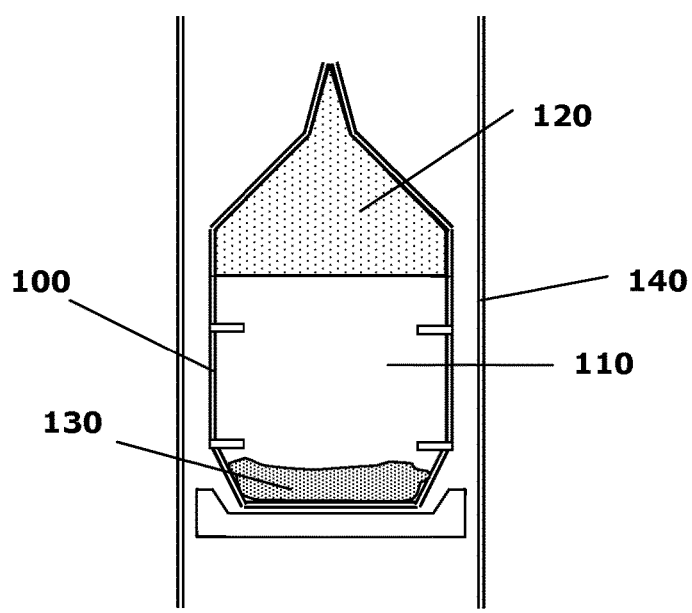
FIG. 1 schematically depicts a crystal growth enclosure for the growth of single-crystalline AlN.

Referring to FIG. 1, AlN crystals can be formed by the sublimation-recondensation method as described in U.S. Pat. No. 6,770,135, the entire disclosure of which is herein incorporated by reference. Crystal growth enclosure 100 includes a vapor mixture 110, an AlN crystal 120, and polycrystalline source 130, and is surrounded by furnace 140. In an embodiment, crystal growth enclosure 100 includes tungsten. In alternative embodiments, crystal growth enclosure 100 includes a tungsten-rhenium alloy, rhenium, carbon, tantalum carbide, tantalum nitride, tantalum carbo-nitride, hafnium nitride, mixtures of tungsten and tantalum, or a combination thereof, as described in U.S. patent application Ser. No. 10/822,336, the entire disclosure of which is herein incorporated by reference.

Vapor mixture 110 arises from the heating of polycrystalline source 130 at one end of crystal growth enclosure 100, and coalesces into AlN crystal 120 at another, cooler end. AlN crystal 120 may include finite concentrations of interstitial or substitutional impurities. Upon further treatment, the impurities can be electrically activated to dope AlN crystal 120 and provide it with desirable electrical properties. In all embodiments described herein, AlN crystal 120 may also include gallium (Ga), rendering it an AlGaN crystal. For example, Ga may be added to polycrystalline source 130 such that the crystal coalesces as AlGaN. In such a case, the crystal may have an Al concentration greater than approximately 50%. AlN crystal 120 may have a thickness of greater than approximately 0.1 mm and a diameter greater than approximately 1 cm. The diameter may even be greater than approximately 2 cm.

Figure 2:
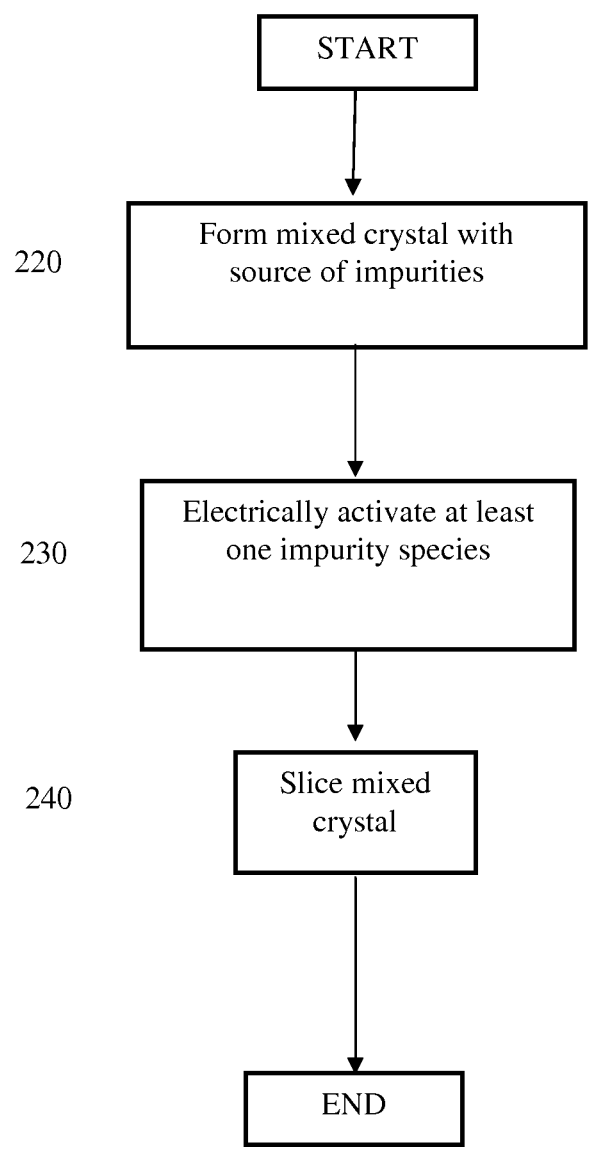
FIG. 2 is a flow chart of a process for forming doped AlN according to many embodiments of the invention.

FIG. 2 illustrates a process 200 for forming a p-type AlN crystal. In step 220, AlN crystal 120, a mixed crystal containing AlN and a source of substitutional or interstitial impurities (i.e., at least one species of dopants), is formed by sublimation-recondensation at a temperature of approximately 2000° C. to approximately 2300° C. The source of the plurality of substitutional impurities is $Be_3N_2$, $Mg_3N_2$, $Zn_3N_2$, $Li_3N$, BeO, $BeSiN_2$, LiBeN, $Be_2C$, $MgSiN_2$, $LiSi_2N_3$, LiMgN, LiZnN, or another suitable material. The corresponding substitutional impurities include Be, Mg, Zn, O, or others. The compound $Be_3N_2$ melts at about 2200° C. and decomposes in 1 bar of $N_2$ at ~2250° C. to liquid Be+$N_2$. The metal Be boils at 2970° C. The compound $Mg_3N_2$ decomposes in 1 bar of $N_2$ at 800 to 900° C. Magnesium melts at 649° C. and boils at 1090° C. In step 230, at least a portion of the plurality of substitutional or interstitial impurities inside AlN crystal 120 is electrically activated. In an embodiment, $Be_3N_2$ is converted to $Be_3N_3$ by a high pressure treatment in a nitrogen ambient, thus electrically activating the Be dopant. Pressures of $N_2$ up to 100 MPa at temperatures up to 2,300° C. and times up to several weeks may be needed. The human toxicity of Be, however, must be borne in mind for commercial applications. In step 240, AlN crystal 120 is sliced into wafers through the use of a wire saw or a diamond annular saw for direct use, or for subsequent epitaxial growth of semiconductor layers and/or device integration thereon.

The doping of AlN may also be accomplished by introducing two or more different elements into the crystal during or after growth. Using two elements is herein referred to as bi-doping; for three elements it is termed tri-doping. The bi-doping approach can be divided into two classes.

The first class is "asymmetric bi-doping" (ABD) in which the two impurities represent a donor element and an acceptor element, and are introduced in approximately equal concentrations. However, at high concentrations, the interaction between the donors is different from that between the acceptors. This difference in the formation of many-body states such as impurity bands and impurity complexes in addition to the activation energies of the isolated single atom impurities is the source of the asymmetry. The donor-acceptor pairs preferably have special properties. Suitable compounds that act as sources for the plurality of impurities include $MgSiN_2$ and $BeSiN_2$. In $MgSiN_2$ or $BeSiN_2$ the Mg or Be acceptors occupy the Al cation lattice site as do the compensating Si donors. Thus, they do not form nearest neighbor pairs in the lattice, and net doping (and hence high conductivity) results.

In the case of $MgSiN_2$ the donors and acceptors do not pair up at the high growth temperature. At doping levels above $10^{18}$ $cm^{-3}$, the Mg, Be, or Si species start to form impurity bands where the holes on the Mg or Be can move from one impurity atom to the nearest identical impurity atom to form a p-type sub-band. When one of the impurity species is Si atoms, the Si wavefunction overlap can form an n-type sub-band. The resultant, doped AlN crystal can be either n-type or p-type depending on which sub-band forms first as the dopant concentration increases. Preferably, impurity species concentrations greater than approximately $10^{18}$ $cm^{-3}$ are introduced, and, even more preferably, concentrations up to $2 \times 10^{22}$ $cm^{-3}$ are introduced. One suitable impurity species source, $BeSiN_2$, is infinitely soluble in solid AlN. (See G. Schneider, L. J. Gauckler, and G. Petzow, J. Am. Ceram. Soc., Vol. 63, p. 32 (1980), the entire disclosure of which is hereby incorporated by reference.) Likewise, $MgSiN_2$ has a high solubility in AlN. Since Si is a shallow donor in AlN and Mg is a deeper acceptor, AlN doped with $MgSiN_2$ is generally n-type.

Another example of the ABD method of making p-type AlN is to place the two different impurities on the N anion lattice sites in AlN. This can be accomplished by making mixed crystals of AlN with $Al_2OC$. The solid solubility of $Al_2OC$ in AlN is as large as $3 \times 10^{22}$ $cm^{-3}$ for both oxygen and carbon. See C. Qui and R. Metselaar, J. Am. Ceram. Soc., Vol. 80, p. 2013 (1997) ("the Qui reference"), the entire disclosure of which is hereby incorporated by reference. In this case, the point defect sources are $Al_2O_3$ and $Al_4C_3$. The gas ambient may include CO, $Al_2O$, AlCN or various mixtures of these three gases, and the substitutional impurities may include C and O.

Carbon may be preferred as a p-type dopant for AlN due to its low toxicity. The compound $Al_4C_3$ exists as yellow crystals. In an inert graphite crucible, it peritectically decomposes at 2156° C. In 100 kPa of $N_2$ above 1500° C., it does not exist: the $Al_4C_3$ reacts with $N_2$ to form AlN and C. Crystals of AlN can be grown by the sublimation—recondensation method in 100 kPa of $N_2$ at 2000° C. to 2300° C. in carbon (graphite) crucibles. They grow well, are yellow in color, and contain hundreds of small, black graphite flakes per $cm^3$ distributed throughout the crystal. The main carbon transport vapor molecule is AlCN. The excess carbon comes out of solution as the crystal anneals at high temperature. The growing time at temperature is approximately 150 hours. These crystals do not conduct electricity at room temperature, possibly because the relatively small amount of C which is introduced into the N lattice site as a substitutional impurity is compensated by N vacancies.

Carbon can be introduced as a substitutional impurity on the nitrogen sites very effectively by employing the compound $Al_2OC$. The compound $Al_2OC$ exists and has almost the same crystal structure as AlN. It is miscible in the solid state with AlN at high temperature from zero to about 40 mole % $Al_2OC$. Both $N_2$ and CO molecules contain 14 electrons. Crystals of $Al_2OC$ themselves are non-conducting. The oxygen impurity enters as a deep donor (on the nitrogen site) and appears to compensate the shallower carbon acceptor. An important factor in successfully growing $Al_2OC$-doped crystals is properly heat-treating them during or after growth to get a uniform, bulk electrical conductivity. This example of ABD depends on the fact that the C acceptor level is significantly shallower than the O donor level and, thus, the $Al_2OC$ compound will effectively act as a p-type dopant at high doping concentrations.

The second class of bi-doping is also asymmetric in the sense that one impurity is substitutional while the other is interstitial. Examples of some useful compounds for bi-doping AlN are LiBeN, LiMgN, and LiZnN. The elements Be, Mg, and Zn will tend to go into the AlN crystal as substitutional impurities while Li will tend to be an interstitial impurity. As an interstitial impurity, the Li atom will be relatively mobile in the AlN lattice. Thus, AlN crystal doped with LiBeN may be electrically activated by extracting the Li ions and leaving the Be in place, resulting in a p-type, electrically conducting semiconductor. The extraction can be carried out by heating the doped AlN crystal under vacuum to evaporate the Li, by immersing the crystal or crystal slices in a liquid gallium (Ga) or indium (In) molten-metal bath, or by drifting the Li to the surface in an applied direct-current (DC) electric field. The Be acceptors (or Mg or Zn) are either isolated, uncompensated acceptors or at higher concentrations form a p-type sub-band. This method of making conducting AlN is termed extraction-activated bi-doping (EABD). Again, the bi-doping permits the AlN to be doped to very high levels of impurity content, which is often not possible with mono-doping employing Be, Mg or Zn by themselves.

Another application of the EABD method of making p-type AlN involves fabrication of an AlN mixed crystal with the compound $LiSi_2N_3$. The Li, which is in this case a substitutional impurity on that Al cation lattice site, is then extracted as indicated above to leave an AlN crystal doped with $V_{Al}Si_2N_3$ (i.e., there are two Si atoms on Al sites for every one Al vacancy). This leaves the crystal as a net p-type semiconductor. However, care should be taken to avoid annealing out too many of the aluminum vacancies ($V_{Al}$) during this process (by going, for instance, to too high a temperature) since a crystal doped with $V_{Al}Si_3N_4$ (i.e., three Si atoms for every one $V_{Al}$) would be completely compensated and would not conduct at low doping concentrations.

Figure 3:
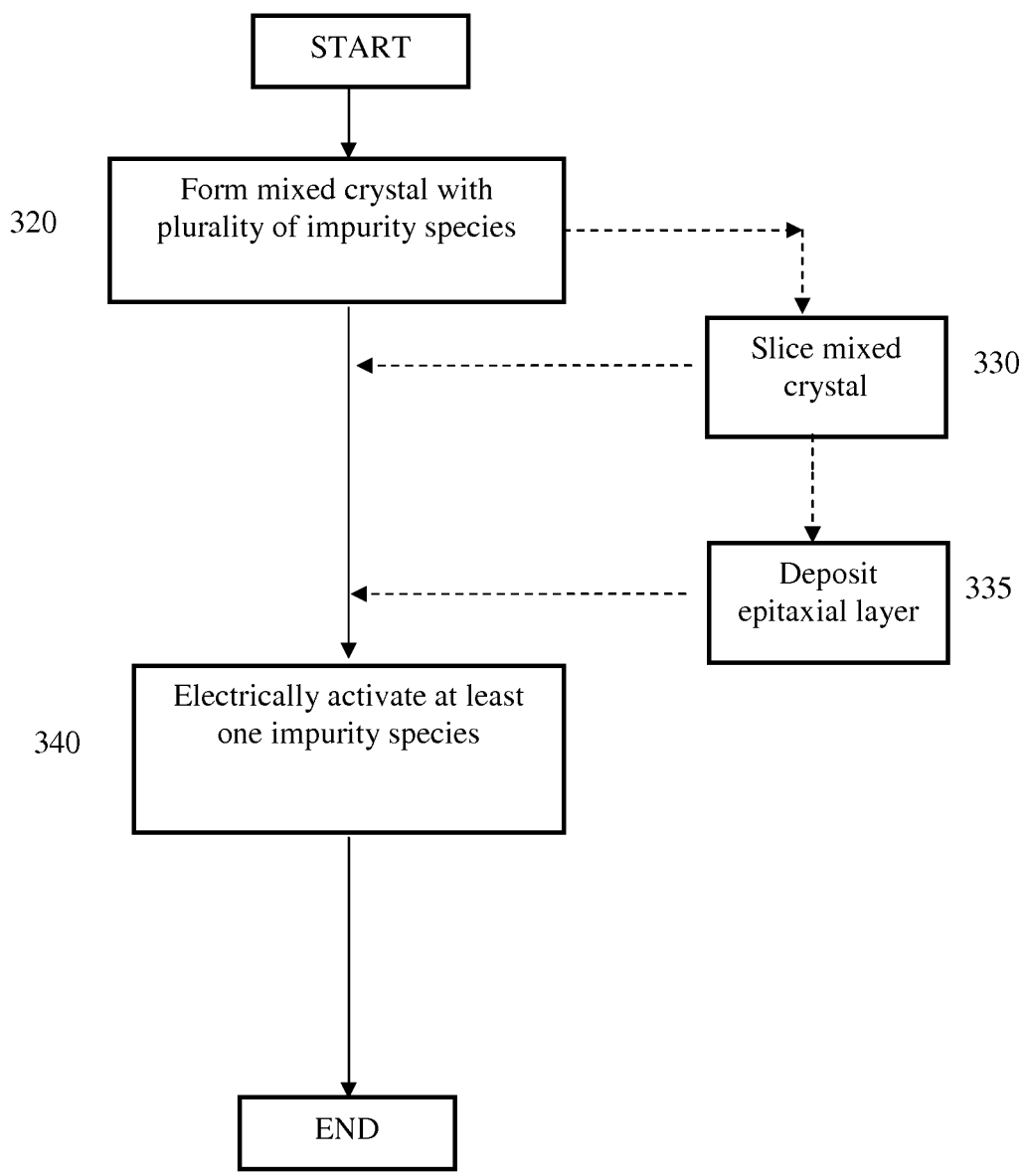
FIG. 3 is a flow chart of a process for forming doped AlN according to other embodiments of the invention.

FIG. 3 illustrates an alternate process 300 for forming a doped AlN crystal. In step 320, AlN crystal 120, a mixed crystal containing AlN and a plurality of impurity species (i.e., different types of dopant atoms), is formed by sublimation-recondensation at a temperature of approximately 2000° C. to approximately 2300° C. The impurity species may include substitutional dopants such as C, O, Be, Mg, Zn, and Si, and/or interstitial dopants such as Li. The impurity species may be introduced by utilizing a compound such as $MgSiN_2$, $BeSiN_2$, $Al_2OC$, LiBeN, LiMgN, LiZnN, or $LiSi_2N_3$ (i.e., a source of one or more impurity species) as a portion of polycrystalline source 130, or by introducing gaseous precursors thereof to vapor mixture 110 such that AlN crystal 120 includes the compound and/or impurity species of interest. At this point, prior to electrical activation, AlN crystal 120 may have a low electrical conductivity, e.g., less than approximately $10^{-2}$ $\Omega^{-1}$ $cm^{-1}$ at room temperature, because the plurality of impurity species may compensate each other. AlN crystal 120 may even have an electrical conductivity less than approximately $10^{-5}$ $\Omega^{-1}$ $cm^{-1}$.

In order to obtain very high concentrations of C on the N anion site in the AlN, a mixed polycrystalline material may be made with 0.1 to 50 mole % of $Al_2OC$ and 99.9 to 50 mole % of AlN. The mixed polycrystalline material is then used as polycrystalline source 130 for growing doped AlN crystals. The mixed polycrystalline source material could be formed by mixing appropriate ratios of AlN and $Al_2OC$ powders and sintering. However, the $Al_2OC$ structure is rather unstable when pure, and is best stabilized by making mixed crystals of it with AlN. This can be done under carefully controlled conditions which take advantage of the thermodynamic properties of $Al_4C_3$, AlN, and $Al_2O_3$.

One such approach to make AlN—$Al_2OC$ polycrystalline material is to add $Al_2O_3$ powder to the Al—N—C mix (specifically, either (i) AlN plus C powders, or (ii) AlN, C and Al powders, or (iii) AlN and $Al_4C_3$ powders) and heat it in order to incorporate a relatively high concentration of $Al_2OC$ into the AlN. This reaction is preferably carried out in the temperature range 1700° C. to 2000° C. where $Al_2OC$ is thermodynamically stable (see, for example, the Qui reference and Y. Larrere, et al., Rev. Int. Hautes Temp. Refract. Fr., Vol. 21, p. 3 (1984), the entire disclosure of which is hereby incorporated by reference). We can calculate that the highest pressure for stability at 2000° C. is about 1 bar. The $Al_2O_3$ plus Al—N—C powders can be cold pressed and then sintered in a threaded-top graphite cylinder at temperatures up to 1990° C. However, the sintering will produce a somewhat porous sample so it is better to hot-press the powders in a tightly sealed graphite die for 2 to 3 hours at about 1900° C. The sealing prevents the gases from leaking out of the pressing die and altering the chemical composition. The use of reactive hot-pressing takes advantage of the 5% volume shrinkage in the reaction of $Al_2O_3$ with $Al_4C_3$ to form $Al_2OC$. It is desirable to cool the mix under pressure to prevent back-reaction. The hot-pressing yields samples with >98.5% of theoretical density as has been shown by S. Y. Kuo and A. V Virkar, J. Am. Ceram. Soc., Vol. 73, p. 2640 (1990), the entire disclosure of which is hereby incorporated by reference.

Growth of AlN crystals with doped polycrystalline material is desirably undertaken with careful attention to the type of crystal growth enclosure 100. For instance, with the use of AlN—$Al_2OC$ polycrystalline starting material, it may be preferable to use a crystal growth enclosure 100 made of TaC or graphite (C).

In an embodiment, the plurality of impurity species includes at least one donor and at least one acceptor. Furthermore, such pairs of impurity species may occupy either cation or anion lattice sites in the AlN lattice. For example, the compound $Al_2OC$ may act as a source of donor species O and acceptor species C, both of which occupy anion (N) lattice sites. In contrast, compounds such as $BeSiN_2$, $MgSiN_2$, and $ZnSiN_2$ may act as sources of donor species Si and acceptor species Be, Mg, and Zn, all of which occupy cation (Al) lattice sites.

With continued reference to FIG. 3, combinations of interstitial and substitutional impurity species may also be introduced in step 320. For example, compounds such as LiBeN, LiMgN, or LiZnN may supply Li as an interstitial impurity and species such as Be, Mg, Zn, or Si as substitutional impurities. In this case, the presence of both the interstitial impurity and the substitutional impurity may leave AlN crystal 120 substantially intrinsic until the interstitial impurity is extracted in subsequent step 340 (described below). Another example is $LiSi_2N_3$ doping, in which both the Li and Si will be substitutional impurities on the Al cation site. Thus, AlN crystal 120 may have a low electrical conductivity, e.g., less than approximately $10^{-2}$ $\Omega^{-1}$ $cm^{-1}$ at room temperature, until the much more mobile substitutional Li impurity is extracted in subsequent step 340 (described below). AlN crystal 120 may even have an electrical conductivity less than approximately $10^{-5}$ $\Omega^{-1}$ $cm^{-1}$ at this stage.

In an embodiment, the source of O impurities is $Al_2O_3$, which supplies point defects in the form of Al vacancies and substitutional O to AlN crystal 120. The $Al_2O_3$ point defect source provides Al vacancies because the $Al_2O_3$ actually dissolves as $Al_2V_{Al}O_3$, where $V_{Al}$ denotes one Al vacancy. At the growing temperature of 2300° C. and at low concentrations of $Al_2O_3$, the O atoms will be randomly distributed on the N sites and the Al vacancies are randomly distributed on the Al sites. During slow cooling, the O atoms may tend to cluster around the Al vacancies because they are slightly larger in diameter than the N atoms, resulting in a stress-relief clustering. This clustering can be prevented by rapid cooling of the crystal from the growth temperature over a period of 30 minutes or less. The rapid cooling will result in an AlN crystal with unclustered point defects of O on the N anion lattice sites and Al vacancies.

In optional step 330, AlN crystal 120, now including at least one impurity species, is sliced into wafers. In optional step 335, an epitaxial layer is deposited on at least one wafer of AlN crystal 120. The epitaxial layer may include AlN, GaN, InN, or alloys or mixtures thereof. The epitaxial layer may have an Al concentration greater than 50%. (Thus, for an $Al_xGa_{1-x}N$ epitaxial layer, x may be greater than 0.5.) During step 335, the epitaxial layer may be doped with at least one impurity species, e.g., O. The epitaxial layer may have a thickness of approximately 0.5 micrometers (μm) to 200 μm. In step 340, at least one impurity species in at least a portion of AlN crystal 120 (and/or in an epitaxial layer deposited thereon), now optionally in wafer form, is electrically activated to form a doped crystal. The crystal (and/or epitaxial layer deposited thereon) may have a net n-type or p-type doping level after electrical activation. Electrical activation may be accomplished by, for example, annealing AlN crystal 120 a temperature range of approximately 2000° C. to approximately 2300° C.

When an interstitial impurity species has been introduced in step 320, step 340 may include methods of extracting the interstitial impurity species while leaving one or more substitutional impurity species activated in AlN crystal 120. In such an embodiment, step 340 may include annealing AlN crystal 120 in a vacuum at a temperature above 300° C. but below 1600° C. (to avoid excessive damage to the AlN host crystal) to evaporate the interstitial impurity species, immersing AlN crystal 120 or wafers therefrom in a liquid gallium (Ga) or indium (In) molten-metal bath, or applying a voltage to AlN crystal 120 in order to drift the interstitial impurity species to the surface.

Step 340 may include annealing in an ambient which may supply at least one additional impurity species to AlN crystal 120. In an embodiment, AlN crystal 120 is annealed at a temperature range of approximately 2000° C. to approximately 2300° C. In the case of an O impurity, the temperature is chosen so as to prevent clustering or to redissolve the O—$V_{Al}$ clusters. The ambient is an atmosphere of, e.g., 90% $N_2$+10% CO at 30 bars, and the anneal time is, e.g., 24 hours with longer times needed for thicker wafers. Some of the CO diffuses into the crystal while some nitrogen and oxygen diffuse out. Thus, the anneal step incorporates C, an additional impurity species, into AlN crystal 120. Similarly, if an epitaxial layer is present on a wafer of AlN crystal 120, such an anneal may supply an additional impurity species to the epitaxial layer. Thus, the epitaxial layer may include a plurality of impurity species, at least one of which is electrically activated.

Once step 340 is complete, AlN crystal 120 and/or an epitaxial layer deposited thereon may have desirable electrical characteristics. These include, for example, an electrical conductivity greater than approximately $10^{-5}$ $\Omega^{-1}$ $cm^{-1}$ at room temperature, or even greater than approximately $3 \times 10^{-3}$ $\Omega^{-1}$ $cm^{-1}$ at room temperature. The electrical conductivity may even be greater than approximately 0.1 $\Omega^{-1}$ $cm^{-1}$ at room temperature. The mobility of AlN crystal 120 and/or an epitaxial layer deposited thereon may be greater than approximately 25 $cm^2$ $V^{-1}$ $s^{-1}$ at room temperature.

The result is a quaternary crystal which is predominately AlN but with high concentrations of O and C on the N lattice sites. It will also have a certain concentration of Al vacancies ($V_{Al}$) due to excess O. During slow cooling, some of the excess O may again cluster about the Al vacancies but the C atoms, being less mobile than the O atoms, do not. The C is in, and stays in solution on the N sites and the C concentration is comparable or greater than the O concentration. AlN crystal 120 is now a good p-type conductor (conductivity $\sigma > 3 \times 10^{-3}$ $cm^{-1}$ at room temperature). In preferred embodiments, AlN crystal 120 has a mobility greater than 25 $cm^2$ $V^{-1}$ $s^{-1}$ at room temperature because the high concentration of C creates a de-localized acceptor band while the deeper donor levels caused by the O remain localized. Preferred AlN crystals have dimensions exceeding 2 mm by 2 mm by 1 mm with conductivities greater than $10^{-5}$ $\Omega^{-1}$ $cm^{-1}$ at room temperature.

The activation energy for this p-type dopant will depend on its concentration, but because of the high solubility of both $Al_2OC$ and $Al_2V_{Al}O_3$ in AlN it is possible to make degenerately doped p-type AlN as well as lightly doped material. It is desirable that the C concentration exceed approximately $1 \times 10^{18}$ $cm^{-3}$ to achieve practical p-type conductivities. Very high C concentrations (up to approximately $2 \times 10^{22}$ $cm^{-3}$) are possible with this technique, and such concentrations are useful for obtaining high p-type doping levels (and higher conductivities).

The $Al_2O_3$ and CO doping and annealing treatments are generally important to control the p-type doping present. In a preferred embodiment, the atom ratio of O to C is approximately one-to-one (1:1) and a large fraction of the C is activated. If more O than this is present, there will be fewer C centers activated, while a lower concentration of O may cause the C to precipitate out and be electrically inactive.

It will be seen that the techniques described herein provide a basis for production of doped crystals and epitaxial layers including AlN and AlGaN. The terms and expressions employed herein are used as terms of description and not of limitation, and there is no intention in the use of such terms and expressions of excluding any equivalents of the features shown and described or portions thereof. Instead, it is recognized that various modifications are possible within the scope of the invention claimed.

What is claimed is:

1. A bi-doped $Al_xGa_{1-x}N$ crystal having a conductivity greater than approximately $10^{-5}$ $\Omega^{-1}$ $cm^{-1}$ at room temperature, the bi-doped $Al_xGa_{1-x}N$ crystal being doped with both (i) a donor species comprising at least one of Si or O and (ii) an acceptor species comprising at least one of Mg, Be, C, or Zn.

2. The $Al_xGa_{1-x}N$ crystal of claim 1, wherein the donor species comprises Si and the acceptor species comprises at least one of Mg, Be, or Zn.

3. The $Al_xGa_{1-x}N$ crystal of claim 1, wherein the conductivity is greater than approximately $3 \times 10^{-3}$ $\Omega^{-1}$ $cm^{-1}$ at room temperature.

4. The $Al_xGa_{1-x}N$ crystal of claim 1, wherein a mobility thereof is greater than approximately 25 $cm^2$ $V^{-1}$ $s^{-1}$ at room temperature.

5. The $Al_xGa_{1-x}N$ crystal of claim 1, wherein a diameter thereof is at least approximately 1 cm.

6. The $Al_xGa_{1-x}N$ crystal of claim 1, wherein a diameter thereof is at least approximately 2 cm.

7. The $Al_xGa_{1-x}N$ crystal of claim 1, wherein the conductivity is n-type.

8. The $Al_xGa_{1-x}N$ crystal of claim 1, wherein x>0.

9. The $Al_xGa_{1-x}N$ crystal of claim 1, wherein x>0.5.

10. The $Al_xGa_{1-x}N$ crystal of claim 1, wherein a thickness thereof is at least approximately 0.1 mm.

11. The $Al_xGa_{1-x}N$ crystal of claim 1, wherein the donor species and the acceptor species are present at approximately equal concentrations.

12. The $Al_xGa_{1-x}N$ crystal of claim 1, wherein the $Al_xGa_{1-x}N$ crystal is disposed within a semiconductor device.

13. The $Al_xGa_{1-x}N$ crystal of claim 1, wherein the $Al_xGa_{1-x}N$ crystal is at least a portion of an epitaxial layer disposed over a substrate.

14. A bi-doped $Al_xGa_{1-x}N$ crystal having a mobility greater than approximately 25 $cm^2$ $V^{-1}$ $s^{-1}$ at room temperature, the bi-doped $Al_xGa_{1-x}N$ crystal being doped with both (i) a donor species comprising O and (ii) an acceptor species comprising C, wherein both the donor species and the acceptor species occupy anion lattice sites in the $Al_xGa_{1-x}N$ crystal.

15. The $Al_xGa_{1-x}N$ crystal of claim 14, wherein a conductivity thereof is p-type.

16. The $Al_xGa_{1-x}N$ crystal of claim 14, wherein at least portions of the donor species and the acceptor species are present within the $Al_xGa_{1-x}N$ crystal as $Al_2OC$ compounds.

17. The $Al_xGa_{1-x}N$ crystal of claim 14, wherein x>0.

18. The $Al_xGa_{1-x}N$ crystal of claim 14, wherein x>0.5.

19. The $Al_xGa_{1-x}N$ crystal of claim 14, wherein the donor species and the acceptor species are present at approximately equal concentrations.

20. The $Al_xGa_{1-x}N$ crystal of claim 14, wherein the $Al_xGa_{1-x}N$ crystal is disposed within a semiconductor device.

21. The $Al_xGa_{1-x}N$ crystal of claim 14, wherein the $Al_xGa_{1-x}N$ crystal is at least a portion of an epitaxial layer disposed over a substrate.

22. The $Al_xGa_{1-x}N$ crystal of claim 14, wherein a conductivity thereof is greater than approximately $10^{-5}$ $\Omega^{-1}$ $cm^{-1}$ at room temperature.

23. The $Al_xGa_{1-x}N$ crystal of claim 14, wherein a conductivity thereof is greater than approximately $3\times10^{-3}$ $\Omega^{-1}$ $cm^{-1}$ at room temperature.

\* \* \* \* \*